(12) United States Patent
Sakogawa (10) Patent No.: US 11,276,679 B2
(45) Date of Patent: Mar. 15, 2022

(54) SEMICONDUCTOR DEVICE AND METHOD OF FORMING THE SAME (71) Applicant: MICRON TECHNOLOGY, INC., Boise, ID (US)

(72) Inventor: Yasuyuki Sakogawa, Higashihiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/878,517

(22) Filed: May 19, 2020

(65) Prior Publication Data

US 2021/0366894 A1 Nov. 25, 2021

(51) Int. Cl.
| | |
|---|---|
| *H01L 27/02* | (2006.01) |
| *H01L 23/522* | (2006.01) |
| *H01L 27/092* | (2006.01) |
| *H01L 27/108* | (2006.01) |
| *H01L 29/49* | (2006.01) |
| *H01L 21/28* | (2006.01) |
| *H01L 21/8238* | (2006.01) |

(52) U.S. Cl.
CPC .... *H01L 27/0207* (2013.01); *H01L 21/28088* (2013.01); *H01L 21/823842* (2013.01); *H01L 21/823871* (2013.01); *H01L 21/823892* (2013.01); *H01L 23/5226* (2013.01); *H01L 27/0928* (2013.01); *H01L 27/10897* (2013.01); *H01L 29/4966* (2013.01)

(58) Field of Classification Search
CPC ............. H01L 27/0207; H01L 27/0928; H01L 27/10897; H01L 21/28088; H01L 21/823842; H01L 21/823871; H01L 21/823892; H01L 23/5226; H01L 29/4966
USPC ........................................................ 257/371
See application file for complete search history.

(56) References Cited

U.S. PATENT DOCUMENTS

| | | | | |
|---|---|---|---|---|
| 10,276,581 | B1 * | 4/2019 | Liaw | .................... H01L 27/0207 |
| 2010/0187610 | A1 * | 7/2010 | Kwon | ............. H01L 21/823857 257/369 |
| 2016/0351675 | A1 * | 12/2016 | Patil | .................. H01L 29/66545 |
| 2018/0301559 | A1 * | 10/2018 | Liaw | ................. H01L 29/66795 |

* cited by examiner

*Primary Examiner* — Tong-Ho Kim
(74) *Attorney, Agent, or Firm* — Dorsey & Whitney LLP (57) ABSTRACT

A semiconductor device includes a semiconductor substrate; and a multilevel wiring structure over the semiconductor substrate, the multilevel wiring structure including a first insulating layer, a first conductive layer on the first insulating layer, a second conductive layer on the first insulating layer, a third conductive layer on the first and second conductive layer, a fourth conductive layer on the third conductive layer, and a second insulating layer on the fourth conductive layer. The multilevel wiring structure includes: a first gate electrode comprising first and second insulating films in the first and second insulating layers, respectively, and first, third and fourth conductive films in the first, third and fourth conductive layers, respectively; and a second gate electrode comprising first and second insulating films in the first and second insulating layers, respectively, and second, third and fourth conductive films in the second, third and fourth conductive layers, respectively.

23 Claims, 5 Drawing Sheets

SEMICONDUCTOR DEVICE AND METHOD OF FORMING THE SAME

BACKGROUND

The process dimension and the chip size of semiconductor devices, for example, Dynamic Random Access Memories (hereinafter referred to as "DRAMs"), are constantly reduced to increase the storage capacity and decrease the cost of the devices. Complementary Metal Oxide Semiconductor (hereinafter referred to as "CMOS") circuits are commonly used in semiconductor devices. The CMOS circuit includes a P-channel metal-oxide-semiconductor field-effect transistor (MOSFET) and an N-channel MOSFET. A P-channel MOSFET is disposed on an N-well and an N-channel MOSFET is disposed on a P-well. In order to decrease the chip size of a semiconductor device, the separation distance between the P-well and the N-well, i.e., the PN isolation width, needs to be reduced.

Usually, the gate electrodes of P-channel MOSFETs and the gate electrodes of N-channel MOSFETs are formed in different process steps to improve the performance of the MOSFETs. A gate electrode comprises a laminated film including a plurality of conductive films and a plurality of insulating films, the thickness of the laminated film being thick with respect to the width of the gate electrode. Thus, in forming the gate electrodes of some MOSFETs, when the plurality of conductive films and the plurality of insulating films of the gate electrodes are formed, those films are inevitably deposited on the sides of the previously formed gate electrodes of other MOSFETs. The subsequently formed gate electrodes, therefore, cannot be disposed within a distance less than the total thickness of the conductive films and the insulating films from the previously formed gate electrodes. Accordingly, it is difficult to reduce the distance between a P-well and an N-well any more.

BRIEF DESCRIPTION OF THE DRAWINGS

FIG. 2 is a diagram illustrating a schematic structure of the semiconductor device according to the embodiment of the present disclosure, which is a vertical cross-sectional view of a schematic structure of the part along the line A-A in FIG. 1.

FIG. 4 is a diagram illustrating a schematic structure of the part along the line A-A in FIG. 1;

FIG. 5 is a diagram illustrating a schematic structure of the part along the line A-A in FIG. 1;

FIG. 6 is a diagram illustrating a schematic structure of the part along the line A-A in FIG. 1;

FIG. 7 is a diagram illustrating a schematic structure of the part along the line A-A in FIG. 1;

FIG. 8 is a diagram illustrating a schematic structure of the part along the line A-A in FIG. 1; FIG. 9 is a diagram illustrating a schematic structure of the part along the line A-A in FIG. 1.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
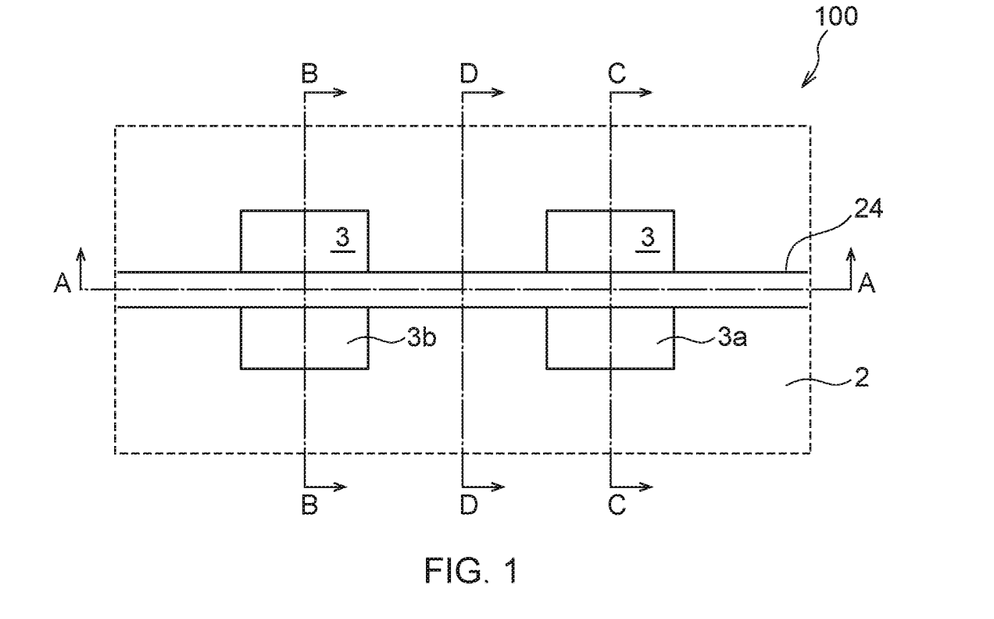
FIG. 1 is a plan view illustrating an example of a schematic structure of a layout for a semiconductor device according to an embodiment of the present disclosure.

Embodiments of the present disclosure will be described with reference to FIG. 1 to FIG. 9. The following description uses a DRAM as an illustrative example of a semiconductor device. FIG. 1 is a plan view illustrating a schematic structure of a layout of an isolation region 2 and a plurality of active regions 3 formed on a semiconductor substrate 1. The active regions 3 are formed in the shape of islands that are rectangular in a plan view. The active regions 3 are surrounded by the isolation region 2. The active regions 3 include an active region 3a and an active region 3b. Adjacent active regions 3 are separated by a predetermined distance E. In FIG. 1, gate electrodes are disposed across the two adjacent active regions 3a and 3b. FIG. 1 shows a second insulating layer 24 that constitutes the top layer of the gate electrodes. The layout in FIG. 1 schematically shows the isolation region 2 and the active regions 3 of a CMOS circuit provided in a semiconductor device 100. The CMOS circuit may include, for example, a data circuit to read and write memory cell data for a DRAM and a control circuit to control the data circuit.

Figure 2:
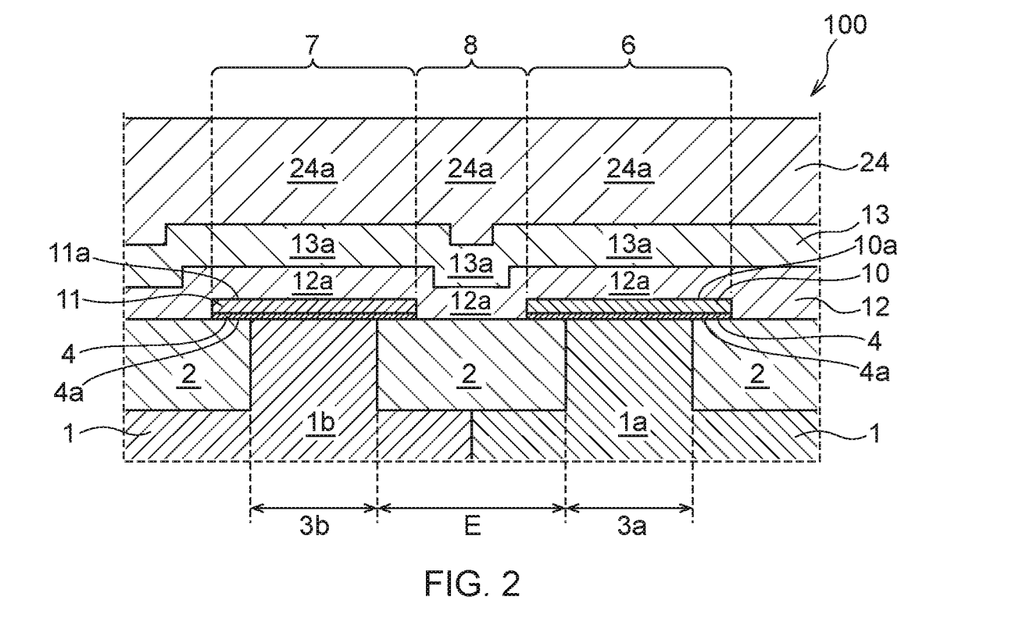
FIG. 2 is also a diagram schematically illustrating a manufacturing method of a semiconductor device according to an embodiment of the present disclosure, which is a vertical cross-sectional view of a schematic structure of a PN boundary part in an exemplary process step following FIG. 9.
Figure 3A:
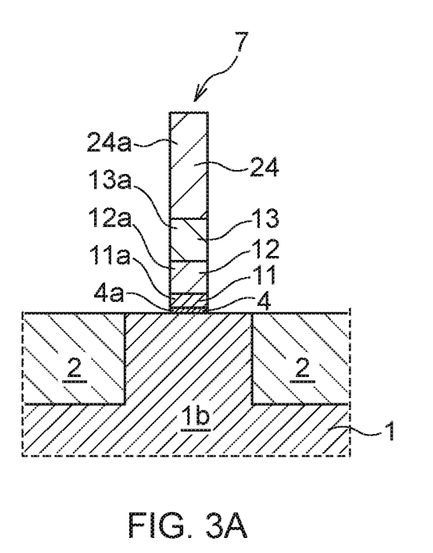
FIG. 3A is a diagram illustrating a schematic structure of the semiconductor device and the manufacturing method thereof according to the embodiments of the present disclosure, which is a vertical cross-sectional view of a schematic structure of the part along the line B-B in FIG. 1.
Figure 3B:
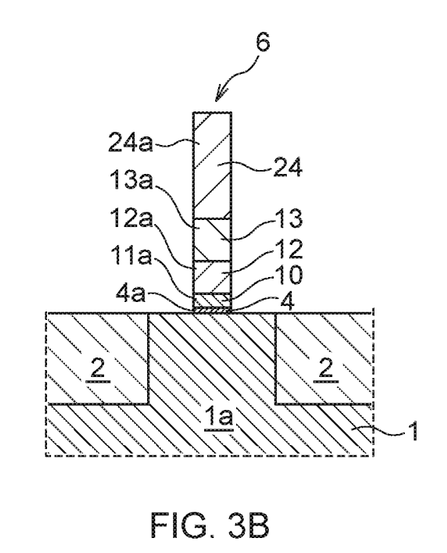
FIG. 3B is a diagram illustrating a schematic structure of the semiconductor device and the manufacturing method thereof according to the embodiments of the present disclosure, which is a vertical cross-sectional view of a schematic structure of the part along the line C-C in FIG. 1.
Figure 3C:
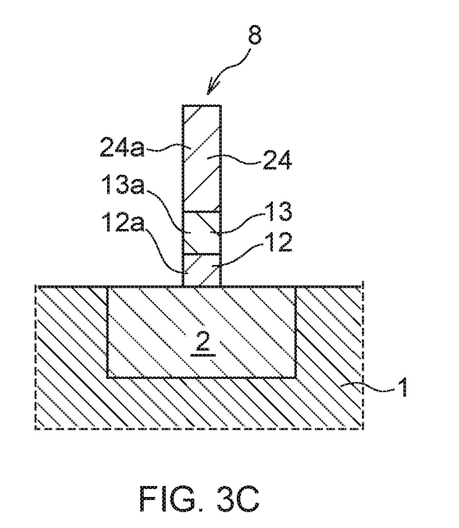
FIG. 3C is a diagram illustrating a schematic structure of the semiconductor device and the manufacturing method thereof according to the embodiments of the present disclosure, which is a vertical cross-sectional view of a schematic structure of the part along the line D-D in FIG. 1.

FIGS. 2, 3A, 3B, and 3C are diagrams illustrating a schematic structure of the semiconductor device 100 according to the embodiments. FIG. 2 is a vertical cross-sectional view of the part along the line A-A in FIG. 1. FIG. 3A is a vertical cross-sectional view of the part along the line B-B in FIG. 1. FIG. 3B is a vertical cross-sectional view of the part along the line C-C in FIG. 1. FIG. 3C is a vertical cross-sectional view of the part along the line D-D in FIG. 1. As illustrated in FIG. 2, the active regions 3 are defined by the isolation region 2 on the semiconductor substrate 1.

The semiconductor substrate 1 may be a silicon wafer including, for example, monocrystalline silicon. The isolation region 2 may include, for example, a shallow trench isolation structure. The isolation region 2 is formed by etching trenches in the semiconductor substrate 1 and depositing an insulating film such as a silicon dioxide ($SiO_2$) film and a silicon nitride (SiN) film to fill the trenches. The isolation region 2 functions to electrically isolate elements formed on the semiconductor substrate 1 from each other.

As illustrated in FIGS. 2, 3A, 3B, and 3C, a first well 1a and a second well 1b, which is disposed adjacent to the first well 1a, are formed in the semiconductor substrate 1. The first well 1a and the second well 1b are situated adjacent to each other with a predetermined distance therebetween. The first well 1a is a P-type semiconductor well doped with an impurity, for example, boron (B). The second well 1b is an N-type semiconductor well doped with an impurity, for example, phosphorus (P). One of the first well 1a and the second well 1b may be referred to as a well of a first conductivity type and the other may be referred to as a well of a second conductivity type in this specification.

The isolation region 2 is disposed between the active region 3a of the first well 1a and the active region 3b of the second well 1b. That is, the active region 3a of the first well 1a and the active region 3b of the second well 1b are separated by the isolation region 2. The distance between the active region 3a and the active region 3b is denoted by E. Accordingly, the width of the isolation region 2, which separates the active region 3a and the active region 3b, is E. The width of the isolation region 2, i.e., the distance E, serves as a PN isolation width for electrically isolating the active region 3a of the first well 1a and the active region 3b of the second well 1b. The first well 1a and the second well 1b are joined together under the isolation region 2. The isolation region 2 constitutes a PN boundary part.

As illustrated in FIGS. 2, 3A, 3B, and 3C, the semiconductor device 100 comprises a multilevel wiring structure over the semiconductor substrate 1. The multilevel wiring structure includes a first insulating layer 4, a first conductive layer 10 on the first insulating layer 4, a second conductive layer 11 on the first insulating layer 4, a third conductive layer 12 on the first and second conductive layers 10, 11, a fourth conductive layer 13 on the third conductive layer 12, and a second insulating layer 24 on the fourth conductive layer 13.

The multilevel wiring structure includes a first gate electrode 6, a second gate electrode 7, and a third gate electrode 8. The first gate electrode 6 includes first and second insulating films 4a, 24a in the first and second insulating layers 4, 24, respectively. Further, the first gate electrode 6 includes first, third and fourth conductive films 10a. 12a, 13a in the first, third and fourth conductive layers 10, 12, 13, respectively. The second gate electrode 7 includes first and second insulating films 4a, 24a in the first and second insulating layers 4, 24, respectively. Further, the second gate electrode 7 includes second, third and fourth conductive films 11a, 12a, 13a in the second, third and fourth conductive layers 11, 12, 13, respectively. The third gate electrode 8 includes second insulating film 24a in the second insulating layers 24, and third and fourth conductive films 12a, 13a in the third and fourth conductive layers 12, 13, respectively.

The first gate electrode 6 is formed on the active region 3a of the first well 1a. The first gate electrode 6 serves as the gate electrode of an N-channel MOSFET. The second gate electrode 7 is formed on the active region 3b of the second well 1b. The second gate electrode 7 serves as the gate electrode of a P-channel MOSFET. FIG. 2 shows a vertical cross-sectional structure in the channel width direction of the MOSFETs mentioned above. In the structure illustrated in FIG. 2, the first gate electrode 6 and the second gate electrode 7 are connected by the third gate electrode 8.

As illustrated in FIG. 3B, in the first gate electrode 6, the first insulating film 4a, the first conductive film 10a, the third conductive film 12a, the fourth conductive film 13a, and the second insulating film 24a are laminated in sequence on the semiconductor substrate 1. As illustrated in FIG. 3A, in the second gate electrode 7, the first insulating film 4a, the second conductive film 11a, the third conductive film 12a, the fourth conductive film 13a, and the second insulating film 24a are laminated in sequence on the semiconductor substrate 1. As illustrated in FIG. 3C, in the third gate electrode 8, the third conductive film 12a, the fourth conductive film 13a, and the second insulating film 24a are laminated in sequence on the isolation region 2 provided in the semiconductor substrate 1.

The first insulating layer 4, which includes the first insulating film 4a, includes a High-k material with a high relative permittivity. The High-k film includes, for example, an oxidized material containing a transition metal and the like. The High-k film includes an oxidized material containing any one of, for example, yttrium (Y), titanium (Ti), zirconium (Zr), hafnium (Hf), niobium (Nb), and tantalum (Ta). The first insulating layer 4 may further include other elements such as silicon and nitrogen. The first insulating film 4a serves as the gate insulating film of the MOSFETs.

The first conductive film 10a included in the first gate electrode 6 and the second conductive film 11a included in the second gate electrode 7 have different work functions. The first conductive film 10a and the second conductive film 11a include, for example, different materials. The first conductive film 10a and the second conductive film 11a include materials having, for example, different element composition ratios.

In the embodiments, the first conductive film 10a included in the first gate electrode 6 may include for example, titanium nitride. The second conductive film 11a included in the second gate electrode 7 may include, for example, titanium nitride. In the embodiments, in the first conductive film 10a and the second conductive film 11a, the composition ratios of nitrogen and titanium are different. Accordingly, the first conductive film 10a and the second conductive film 11a have different work functions.

The work function of the first conductive film 10a is set to be suitable for the N-channel MOSFET. The work function of the second conductive film 11a is set to be suitable for the P-channel MOSFET. For example, when the threshold voltage of the MOSFETs is set to 0.1 to 0.2 V, the work function of the first conductive film 10a of the N-type MOSFET may be set to 4.3 eV or less. Then, the work function of the second conductive film 11a of the P-type MOSFET may be set to, for example, 4.8 eV or higher.

The first conductive film 10a and the second conductive film 11a are formed in different process steps. This enables controlling the formation of the first conductive film 10a and the second conductive film 11a independently so that those conducive films can have any work functions. Thus, the characteristics of the N-channel MOSFET disposed in the first well 1a and the P-channel MOSFET disposed in the second well 1b can be independently optimized. In consequence, the performance of the N-channel MOSFET and the P-channel MOSFET included in the CMOS circuit can be improved.

The first gate electrode 6 and the second gate electrode 7 include the first insulating film 4a in common. The first insulating film 4a included in the first gate electrode 6 and the first insulating film 4a included in the second gate electrode 7 include the same material and are formed in the same process step.

The first gate electrode 6, the second gate electrode 7, and the third gate electrode 8 include the third conductive film 12a, the fourth conductive film 13a, and the second insulating film 24a in common. The third conductive film 12a included in the first gate electrode 6, the third conductive film 12a included in the second gate electrode 7, and the third conductive film 12a included in the third gate electrode 8 include the same material and are formed in the same process step. The fourth conductive film 13a included in the first gate electrode 6, the fourth conductive film 13a included in the second gate electrode 7, and the fourth conductive film 13a included in the third gate electrode 8 include the same material and are formed in the same process step. The second insulating film 24a included in the first gate electrode 6, the second insulating film 24a included in the second gate electrode 7, and the second insulating film 24a included in the third gate electrode 8 include the same material and are formed in the same process step.

The first gate electrode 6 and the second gate electrode 7 are separated by a distance of the total of the thickness of the second conductive layer 11 and the thickness of a second cap insulating layer 20 described below, or greater. The first gate electrode 6 and the second gate electrode 7 can be disposed closer together with the minimum distance between those gate electrodes being the total of the thickness of the second conductive layer 11 and the thickness of the second cap insulating layer 20 described below.

A manufacturing method of the semiconductor device 100 will now be described with reference to FIG. 1 to FIG. 9.

Figure 4:
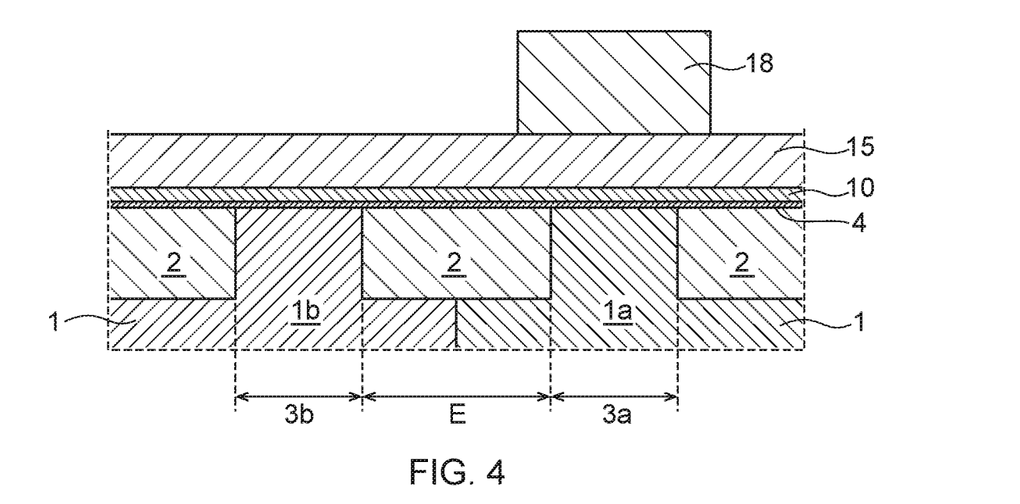
FIG. 4 is a diagram schematically illustrating the manufacturing method of a semiconductor device according to the embodiment of the present disclosure, which is a vertical cross-sectional view of a schematic structure of the PN boundary part in an exemplary process step.

As illustrated in FIG. 4, a first insulating layer 4, a first conductive layer 10, and a first cap insulating layer 15 are formed on a semiconductor substrate 1 in which a first well 1a and a second well 1b, which is disposed adjacent to the first well 1a, have already been provided. For example, a monocrystalline silicon substrate may be used as the semiconductor substrate 1. The first well 1a is doped with a P-type impurity, for example, boron (B). The second well 1b is doped with an N-type impurity, for example, phosphorus (P). The first well 1a and the second well 1b are formed by doping those wells 1a and 1b with impurities and then heat treating them.

An isolation region 2 and active regions 3a and 3b, which are defined by the isolation region 2, have also been provided in the semiconductor substrate 1. The isolation region 2 include a shallow trench isolation structure in which an insulating film, for example, a silicon dioxide film, is deposited so as to fill trenches etched in the semiconductor substrate 1. The isolation region 2 has a width E. The active region 3a provided in the first well 1a and the active region 3b provided in the second well 1b are separated by a distance of E by the isolation region 2.

The first insulating layer 4 includes a High-k film. The High-k film may include, for example, an oxidized material containing a transition metal and the like. The High-k film may include an oxidized material containing any one of, for example, yttrium (Y), titanium (Ti), zirconium (Zr), hafnium (Hf), niobium (Nb), and tantalum (Ta). The first insulating layer 4 may further include other elements such as silicon and nitrogen. The first insulating layer 4 is formed by using a film formation method such as chemical vapor deposition (hereinafter referred to as "CVD") and sputtering.

The first conductive layer 10 may comprise a conductive material including, for example, a metal or a metal compound. In the present embodiment, the first conductive layer 10 may include, for example, titanium nitride (TiN). The first conductive layer 10 may be formed by using a film formation method such as CVD and sputtering. The first cap insulating layer 15 may include, for example, a silicon dioxide ($SiO_2$) film. The first cap insulating layer 15 may be formed, for example, by CVD.

After the laminated film is deposited as described above, a photoresist pattern 18 is formed on the semiconductor substrate 1. The photoresist pattern 18 is formed by a known photolithography method. The photoresist pattern 18 is formed by patterning so as to have a shape corresponding to a first portion G described below.

Figure 5:
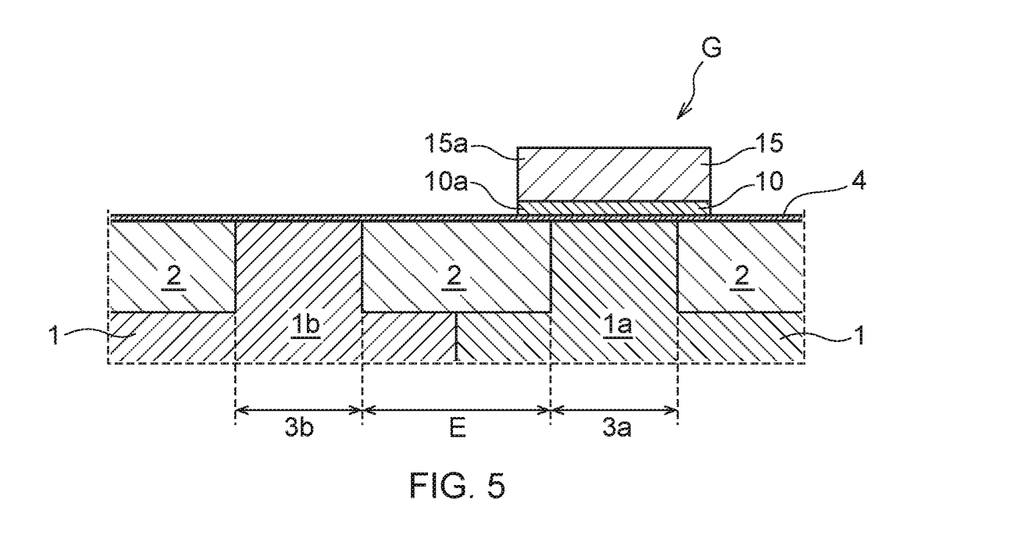
FIG. 5 is a diagram schematically illustrating the manufacturing method of a semiconductor device according to the embodiment of the present disclosure, which is a vertical cross-sectional view of a schematic structure of the PN boundary part in an exemplary process step following FIG. 4.

The first cap insulating layer 15 and the first conductive layer 10 are removed in sequence by performing anisotropic dry etching with the photoresist pattern 18 used as an etching mask. Then, the photoresist pattern 18 is removed, for example, by $O_2$ plasma ashing. Consequently, as illustrated in FIG. 5, the first portion G, in which a first conductive film 10a and a first cap insulating film 15a are laminated over the first well 1a, remains and the first insulating layer 4 is exposed over the second well 1b.

Figure 6:
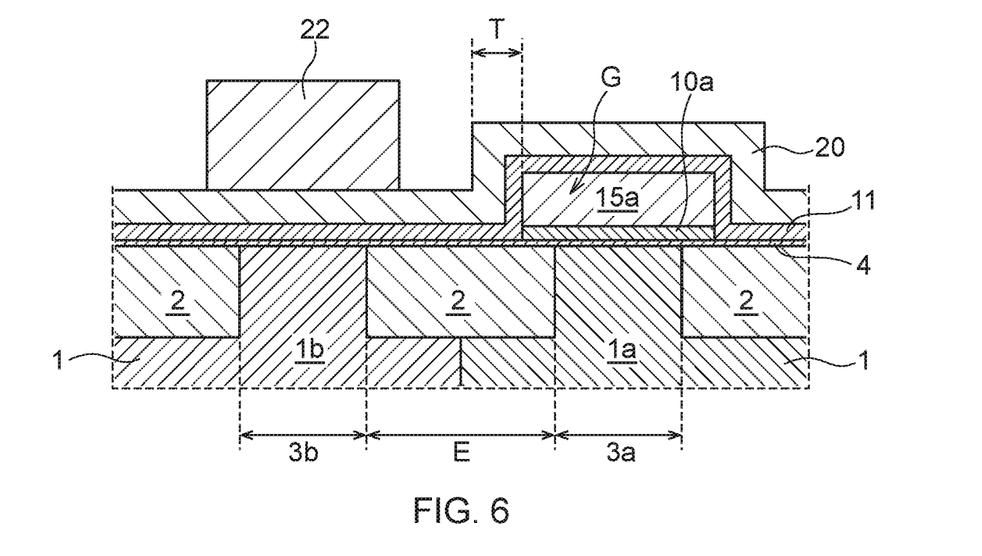
FIG. 6 is a diagram schematically illustrating the manufacturing method of a semiconductor device according to the embodiment of the present disclosure, which is a vertical cross-sectional view of a schematic structure of the PN boundary part in an exemplary process step following FIG. 5.

As illustrated in FIG. 6, A second conductive layer 11 and a second cap insulating layer 20 are formed on the top surface of the semiconductor substrate 1 having the first portion G formed thereon. The second conductive layer 11 may include a conductive material including, for example, a metal or a metal compound. In the present embodiment, the second conductive layer 11 may include, for example, titanium nitride (TiN). The second conductive layer 11 may be formed by using a film formation method such as CVD and sputtering.

The second conductive layer 11 and the first conductive layer 10 have different work functions. The first conductive layer 10 and the second conductive layer 11 include materials having different element composition ratios. In the present embodiment, in the first conductive layer 10 and the second conductive layer 11, the composition ratios of titanium (Ti) and nitrogen (N) are different. The work function of titanium nitride can be controlled by controlling the composition ratio of titanium (Ti) and nitrogen (N). The composition ratio for the first conductive film 10a is set to be optimal for the gate electrode of the N-channel MOSFET disposed in the first well 1a. The composition ratio for a second conductive film 11a is set to be optimal for the gate electrode of the P-channel MOSFET disposed in the second well 1b.

The second cap insulating layer 20 may include, for example, a silicon dioxide (SiO$_2$) film. The second cap insulating layer 20 may be formed, for example, by CVD.

At this point, the second conductive layer 11 and the second cap insulating layer 20 are also laminated on the sides of the first portion G to form a film. The thickness of the stacked structure including the second conductive layer 11 and the second cap insulating layer 20 is T.

After the laminated film is deposited as described above, a photoresist pattern 22 is formed on the semiconductor substrate 1. The photoresist pattern 22 is formed by a known photolithography method. The photoresist pattern 22 is formed by patterning so as to have a shape corresponding to a second portion H described below. The stacked structure having a thickness of T and including the second conductive layer 11 and the second cap insulating layer 20 lies on the sides of the first portion G. The photoresist pattern 22 may be disposed at a distance of T or farther from the sides of the first portion G in some embodiments. The photoresist pattern 22 may be disposed at a distance less than T from the sides of the first portion G in other embodiments.

Figure 7:
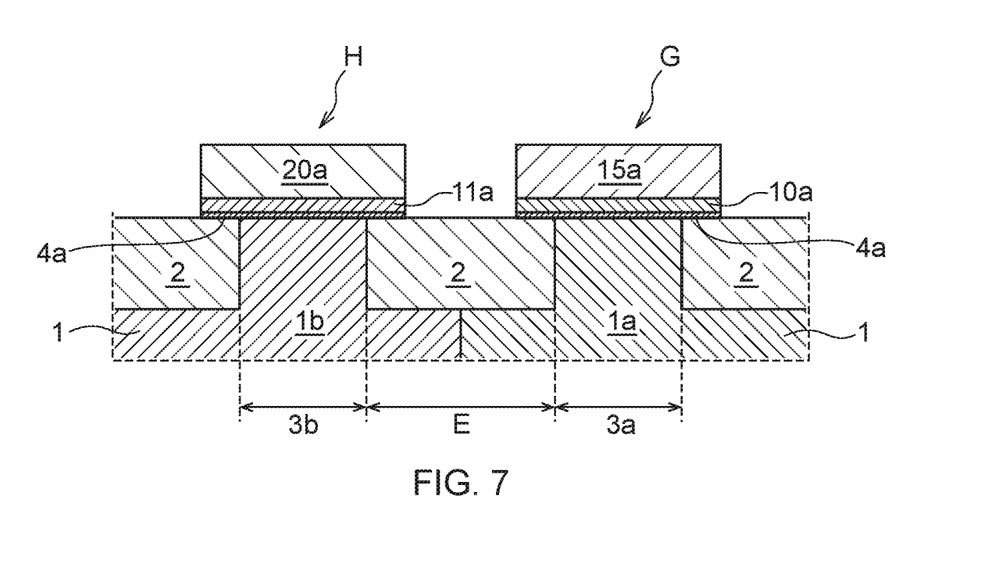
FIG. 7 is a diagram schematically illustrating the manufacturing method of a semiconductor device according to the embodiment of the present disclosure, which is a vertical cross-sectional view of a schematic structure of the PN boundary part in an exemplary process step following FIG. 6.

The second cap insulating layer 20 and the second conductive layer 11 are removed in sequence by performing anisotropic dry etching with the photoresist pattern 22 used as an etching mask. Then, the photoresist pattern 22 is removed, for example, by O$_2$ plasma ashing. Consequently, as illustrated in FIG. 7, the first portion G remains over the first well 1a, and the second portion H, in which the second conductive film 11a and a second cap insulating film 20a are laminated over the second well 1b, is formed. The second portion H has a pattern transferred from the photoresist pattern 22. In the portions where neither the first portion G nor the second portion H is formed, the first insulating layer 4 is exposed. The second portion H is disposed at a distance of T or farther from the sides of the first portion G. The second portion H can be disposed closer to the sides of the first portion G with the minimum distance being T.

Figure 8:
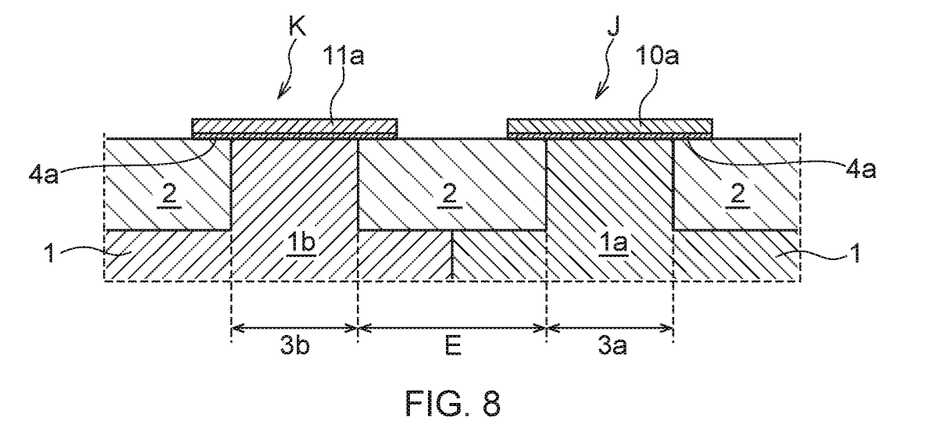
FIG. 8 is a diagram schematically illustrating the manufacturing method of a semiconductor device according to the embodiment of the present disclosure, which is a vertical cross-sectional view of a schematic structure of the PN boundary part in an exemplary process step following FIG. 7.

As illustrated in FIG. 7, the exposed first insulating layer 4 is removed by wet etching with the first portion G including the first cap insulating film 15a and the second portion H including the second cap insulating film 20a used as etching masks. As illustrated in FIG. 8, the first cap insulating film 15a and the second cap insulating film 20a are then removed by etching with, for example, buffered hydrogen fluoride solution. This results in a structure J in which a first insulating film 4a and the first conductive film 10a are laminated and a structure K in which the first insulating film 4a and the second conductive film 11a are laminated.

Figure 9:
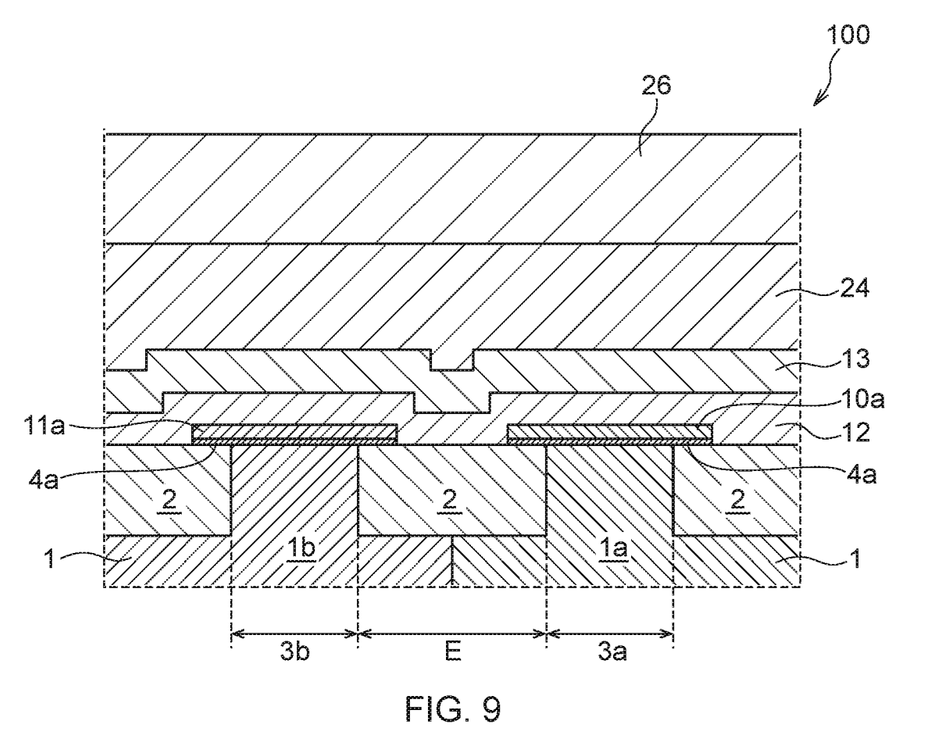
FIG. 9 is a diagram schematically illustrating the manufacturing method of a semiconductor device according to the embodiment of the present disclosure, which is a vertical cross-sectional view of a schematic structure of the PN boundary part in an exemplary process step and continues to FIG. 8.

As illustrated in FIG. 9, a third conductive layer 12, a fourth conductive layer 13, and a second insulating layer 24 are formed on the semiconductor substrate 1 having the structure J and the structure K formed thereon. The third conductive layer 12 may include, for example, polysilicon (poly Si). The third conductive layer 12 may be doped with an impurity, for example, phosphorus (P) or boron (B). The third conductive layer 12 may be formed, for example, by CVD. The fourth conductive layer 13 may include, for example, metal. In the present embodiment, the fourth conductive layer 13 may include, for example, tungsten (W). The fourth conductive layer 13 may be formed, for example, by CVD. The second insulating layer 24 may include, for example, a silicon dioxide (SiO$_2$) film. The second insulating layer 24 may be formed, for example, by CVD.

After the laminated film is deposited as described above, a photoresist pattern 26 is formed on the semiconductor substrate 1. The photoresist pattern 26 is formed by a known photolithography method. The photoresist pattern 26 is formed by patterning so as to have a shape corresponding to a first gate electrode 6, a second gate electrode 7, and a third gate electrode 8 connecting the first and second electrodes, which are described below.

As illustrated in FIG. 2, the second insulating layer 24, the fourth conductive layer 13, and the third conductive layer 12 are patterned by anisotropic dry etching with the photoresist pattern 26 used as an etching mask. Then, the photoresist pattern 26 is removed, for example, by O$_2$ plasma ashing. The foregoing process steps result in the first gate electrode 6, the second gate electrode 7, and the third gate electrode 8 as illustrated in FIGS. 2, 3A, 3B, and 3C. Finally, the semiconductor device 100 is provided through the foregoing process steps.

The embodiments described above have the following advantageous effects.

The distance between the first portion G and the second portion H is one of the factors that determine the width E of the isolation region 2, i.e., the PN isolation width E. The reduction of the distance between the first portion G and the second portion H leads to the reduction of the PN isolation width E. In turn, the reduction of the PN isolation width E leads to the reduction of chip area of the semiconductor device 100. In the semiconductor device 100 and the manufacturing method thereof according to the embodiments, the first portion G including the first conductive film 10a and the second portion H including the second conductive film 11a are formed in different process steps, and the third conductive film 12a, the fourth conductive film 13a, and the second insulating film 24a are formed in the same process step. When the second portion H is formed adjacent to the first portion G, the second conductive layer 11 and the second cap insulating layer 20 are formed. Thus, the second portion H can be disposed closer to the sides of the first portion G with the minimum distance being the thickness T of the stacked structure including the second conductive layer 11 and the second cap insulating layer 20. In the semiconductor device 100 and the manufacturing method thereof according to the embodiments, the PN isolation width E can be reduced to the distance T, which enables the reduction of chip area of the semiconductor device 100. In consequence, the lower-cost semiconductor device 100 and the manufacturing method thereof can be provided.

The work function of the first conductive film 10a included in the first gate electrode 6 disposed on the first well 1a and the work function of the second conductive film 11a included in the second gate electrode 7 disposed on the second well 1b are different. The work function of the first conductive film 10a is set to be suitable for the material of the gate electrode of the N-channel MOSFET. The work function of the second conductive film 11a is set to be suitable for the material of the gate electrode of the P-channel MOSFET. This can improve the performance of the CMOS circuit including the N-channel MOSFET and the P-channel MOSFET, thereby providing the semiconductor device 100 that gives higher performance.

In the first gate electrode 6 disposed on the first well 1a and the second gate electrode 7 disposed on the second well 1b, the third conductive film 12a, the fourth conductive film 13a, and the second insulating film 24a are formed in the same process step. This can reduce the number of process steps as compared to the case of forming them independently in different process steps. The lower-cost semiconductor device 100 and the manufacturing method thereof can therefore be provided.

As above, DRAM is described as an example of the semiconductor device 100 according to various embodiments, but the above description is merely one example and not intended to be limited to DRAM. Memory devices other than DRAM, such as static random-access memory (SRAM), flash memory, erasable programmable read-only memory (EPROM), magnetoresistive random-access memory (MRAM), and phase-change memory for example can also be applied as the semiconductor device 100. Furthermore, devices other than memory, including logic ICs such as a microprocessor and an application-specific integrated circuit (ASIC) for example are also applicable as the semiconductor device 100 according to the foregoing embodiments.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. A semiconductor device comprising:
a semiconductor substrate; and
a multilevel wiring structure over the semiconductor substrate, the multilevel wiring structure including a first insulating layer, a first conductive layer on the first insulating layer, a second conductive layer on the first insulating layer, a third conductive layer on the first and second conductive layers and between the first and second conductive layers, a fourth conductive layer on the third conductive layer and a second insulating layer on the fourth conductive layer,
wherein the multilevel wiring structure includes:
a first gate structure comprising first and second insulating films in the first and second insulating layers, respectively, and first, third and fourth conductive films in the first, third and fourth conductive layers, respectively; and
a second gate structure comprising first and second insulating films in the first and second insulating layers, respectively, and second, third and fourth conductive films in the second, third and fourth conductive layers, respectively,
wherein the first conductive film and the second conductive film are separated by a distance.

2. The semiconductor device of claim 1, wherein the third conductive film included in the first gate structure and the third conductive film included in the second gate structure comprise a first material, and the fourth conductive film included in the first gate structure and the fourth conductive film included in the second gate structure comprise a second material.

3. The semiconductor device of claim 1, wherein the third conductive film included in the first gate structure and the third conductive film included in the second gate structure are formed in a same process step, and the fourth conductive film included in the first gate structure and the fourth conductive film included in the second gate structure are formed in a same process step.

4. The semiconductor device of claim 1, wherein the first conductive film included in the first gate structure and the second conductive film included in the second gate structure have different work functions.

5. The semiconductor device of claim 4, wherein the first conductive film included in the first gate structure and the second conductive film included in the second gate structure are formed in different process steps.

6. The semiconductor device of claim 4, wherein the first conductive film included in the first gate structure and the second conductive film included in the second gate structure comprise titanium nitride.

7. The semiconductor device of claim 4, wherein the semiconductor substrate comprises a first well of a first conductivity type above which the first gate structure is disposed, and a second well of a second conductivity type above which the second gate structure is disposed.

8. The semiconductor device of claim 4, further comprising:
a third gate structure connecting the first gate structure and the second gate structure,
wherein the third gate structure includes the third conductive film and the fourth conductive film.

9. The semiconductor device of claim 4, wherein the first insulating film includes a High-k material.

10. The apparatus of claim 4, wherein the distance is a first distance, and
wherein the semiconductor substrate comprises a first well and a second well separate from each other, and
wherein the first gate structure and the second gate structure are disposed on the first well and the second well, respectively.

11. A semiconductor device comprising:
a semiconductor substrate; and
a multilevel wiring structure over the semiconductor substrate, the multilevel wiring structure including a first insulating layer, a first conductive layer on the first insulating layer, a second conductive layer on the first insulating layer, a third conductive layer on the first and second conductive layer, a fourth conductive layer on the third conductive layer and a second insulating layer on the fourth conductive layer,
wherein the multilevel wiring structure includes:
a first gate structure comprising first and second insulating films in the first and second insulating layers, respectively, and first, third and fourth conductive films in the first, third and fourth conductive layers, respectively; and
a second gate structure comprising first and second insulating films in the first and second insulating layers, respectively, and second, third and fourth conductive films in the second, third and fourth conductive layers, respectively,
wherein the first conductive film included in the first gate structure and the second conductive film included in the second gate structure comprise titanium nitride, and
wherein a composition ratio of titanium and nitrogen in titanium nitride included in the first conductive film is different from a composition ratio of titanium and nitrogen in titanium nitride included in the second conductive film.

12. A method of manufacturing a semiconductor device comprising:
forming a first well of a first conductivity type and a second well of a second conductivity type with a distance therebetween;
forming a first insulating film, a first conductive film and a first cap insulating film in sequence to cover each of the first and second wells;
etching the first cap insulating film and the first conductive film to leave a first portion of the first cap insulating film and the first conductive film over the first well and expose the first insulating film over the second well;
forming a second conductive film and a second cap insulating film in sequence to cover the first insulating film over the second well and the first portion over the first well; and
etching the second conductive film and the second cap insulating film to leave a second portion of the second conductive film and the second cap insulating film over the second well and expose the first portion over the first well.

13. The method of claim 12, wherein the first conductive film and the second conductive film have different work functions.

14. The method of claim 12, wherein the first conductive film and the second conductive film comprise titanium nitride.

15. The method of claim 14, wherein a composition ratio of titanium and nitrogen in titanium nitride included in the first conductive film is different from a composition ratio of titanium and nitrogen in titanium nitride included in the second conductive film.

16. The method of claim 12, further comprising:
removing the first insulating film other than the first portion and the second portion;
forming a third conductive film, a fourth conductive film, and a second insulating film to cover the first portion and the second portion; and
forming a first gate structure including the first portion, the third conductive film, the fourth conductive film, and the second insulating film; and
forming a second gate structure including the second portion, the third conductive film, the fourth conductive film, and the second insulating film.

17. The method of claim 12, wherein a first gate structure and the second gate structure are connected by a third gate structure, and a third gate structure includes a third conductive film and a fourth conductive film.

18. A method of manufacturing a semiconductor device including a first well of a first conductivity type and a second well of a second conductivity type with a distance therebetween, the method comprising:
forming a first gate structure including a first insulating film, a first conductive film, a third conductive film, and a fourth conductive film above the first well;
forming a second gate structure including a first insulating film, a second conductive film, a third conductive film, and a fourth conductive film on the second well; and
forming a third conductive layer between the first conductive film included in the first gate structure and the second conductive film included in the second gate structure, the third conductive layer including a third conductive film, wherein the first conductive film included in the first gate structure and the second conductive film included in the second gate structure are formed in different process steps, and
wherein the third conductive film included in the first gate structure, the third conductive film included in the second gate structure, and the third conductive film included in the third conductive layer are formed in a same process step.

19. The method of claim 18, wherein the first conductive film and the second conductive film have different work functions.

20. The method of claim 18, wherein the first gate structure and the second gate structure are connected by a third gate structure, and the third gate structure includes a third conductive film and a fourth conductive film.

21. The method of claim 18, wherein the first conductive film and the second conductive film are separated from each other.

22. A method of manufacturing a semiconductor device including a first well of a first conductivity type and a second well of a second conductivity type with a distance therebetween, the method comprising:
forming a first gate structure including a first insulating film, a first conductive film, a third conductive film, and a fourth conductive film above the first well; and
forming a second gate structure including a first insulating film, a second conductive film, a third conductive film, and a fourth conductive film on the second well,
wherein the first conductive film included in the first gate structure and the second conductive film included in the second gate structure are formed in different process steps,
wherein the third conductive film included in the first gate structure and the third conductive film included in the second gate structure are formed in a same process step, and
wherein a composition ratio of titanium and nitrogen in titanium nitride included in the first conductive film is different from a composition ratio of titanium and nitrogen in titanium nitride included in the second conductive film.

23. A method of manufacturing a semiconductor device including a first well of a first conductivity type and a second well of a second conductivity type with a distance therebetween, the method comprising:
forming a first gate structure including a first insulating film, a first conductive film, a third conductive film, and a fourth conductive film above the first well; and
forming a second gate structure including a first insulating film, a second conductive film, a third conductive film, and a fourth conductive film on the second well,
wherein the first conductive film included in the first gate structure and the second conductive film included in the second gate structure are formed in different process steps,
wherein the third conductive film included in the first gate structure and the third conductive film included in the second gate structure are formed in a same process step, and
wherein the forming of the first gate structure comprises:
forming the first insulating film, the first conductive film, and a first cap insulating film in sequence to cover the first well; and etching the first cap insulating film and the first conductive film over the first well.

* * * * *